(12) United States Patent
Sung et al.

(10) Patent No.: US 11,408,087 B2
(45) Date of Patent: Aug. 9, 2022

(54) ADVANCED ELECTRODEPOSITED COPPER FOIL HAVING ISLAND-SHAPED MICROSTRUCTURES AND COPPER CLAD LAMINATE USING THE SAME

(71) Applicant: CO-TECH DEVELOPMENT CORP., Taipei (TW)

(72) Inventors: Yun-Hsing Sung, Taoyuan (TW); Shih-Shen Lee, New Taipei (TW); Hung-Wei Hsu, Yun Lin (TW); Chun-Yu Kao, Yunlin County (TW)

(73) Assignee: CO-TECH DEVELOPMENT CORP., Taipei (TW)

(*) Notice: Subject to any disclaimer, the term of this patent is extended or adjusted under 35 U.S.C. 154(b) by 146 days.

(21) Appl. No.: 16/905,934

(22) Filed: Jun. 19, 2020

(65) Prior Publication Data

US 2020/0399776 A1 Dec. 24, 2020

Related U.S. Application Data

(60) Provisional application No. 62/863,827, filed on Jun. 19, 2019.

(30) Foreign Application Priority Data

Jun. 18, 2020 (TW) .................. 109120638

(51) Int. Cl.
*B32B 15/00* (2006.01)
*C25D 5/16* (2006.01)
*H05K 1/03* (2006.01)
*C25D 3/38* (2006.01)

(52) U.S. Cl.
CPC .......... *C25D 5/16* (2013.01); *C25D 3/38* (2013.01); *H05K 1/03* (2013.01); *H05K 2201/0355* (2013.01); *Y10T 428/12431* (2015.01)

(58) Field of Classification Search
None
See application file for complete search history.

(56) References Cited

U.S. PATENT DOCUMENTS 6,475,638 B1 * 11/2002 Mitsuhashi ............ H05K 3/382
428/606
2005/0067378 A1 3/2005 Fuerhaupter et al.
2010/0038115 A1 2/2010 Matsuda et al.
2011/0262764 A1 * 10/2011 Arai ....................... C25D 5/605
428/551

(Continued)

FOREIGN PATENT DOCUMENTS

CN 102574365 A 7/2012
CN 103562440 A 2/2014

(Continued)

*Primary Examiner* — Seth Dumbris
(74) *Attorney, Agent, or Firm* — Li & Cai Intellectual Property Office

(57) ABSTRACT

An advanced electrodeposited copper foil having island-shaped microstructures and a copper clad laminate using the same are provided. The advanced electrodeposited copper foil includes a micro-roughened surface. The micro-roughened surface has a plurality of copper crystals, a plurality of copper whiskers and a plurality of copper crystal groups which are in a non-uniform distribution and form into island-shaped patterns.

18 Claims, 9 Drawing Sheets

(56) References Cited

U.S. PATENT DOCUMENTS

2012/0111613 A1* 5/2012 Oguro .................. H05K 1/167
                                                        174/254
2018/0255646 A1   9/2018 Moriyama
2018/0288884 A1  10/2018 Ori et al.

FOREIGN PATENT DOCUMENTS

| CN | 104372384 A | 2/2015 |
| CN | 105934307 A | 9/2016 |
| JP | 2018141228 A | 9/2018 |
| TW | 201317399 A1 | 5/2013 |
| TW | 201644332 A | 12/2016 |
| TW | 201837243 A | 10/2018 |
| WO | WO2016174998 A1 | 11/2016 |
| WO | WO2017006739 A1 | 1/2017 |
| WO | WO2017138338 A1 | 8/2017 |

* cited by examiner

US 11,408,087 B2

ADVANCED ELECTRODEPOSITED COPPER FOIL HAVING ISLAND-SHAPED MICROSTRUCTURES AND COPPER CLAD LAMINATE USING THE SAME

CROSS-REFERENCE TO RELATED PATENT APPLICATION

This application claims the benefit of priority to Taiwan Patent Application No. 109120638, filed on Jun. 18, 2020. The entire content of the above identified application is incorporated herein by reference.

This application claims priority from the U.S. Provisional Patent Application Ser. No. 62/863,827 filed Jun. 19, 2019, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electrodeposited copper foil, and more particularly to an advanced electrodeposited copper foil having island-shaped microstructures and a copper clad laminate using the same.

BACKGROUND OF THE DISCLOSURE

With the development of information and electronic industries, high frequency and high speed signal transmission has become an integral part of modern circuit design and manufacture. In order to meet the requirements of high frequency and high speed signal transmission electronic products, a copper clad laminate (CCL) needs to be made to reduce the excessive insertion loss while transmitting a high frequency signal, so as to achieve good signal integrity (SI). In particular, the insertion loss of a copper foil in the copper foil substrate is highly correlated with the surface roughness of a surface-treated surface thereof as a skin effect, a phenomenon of uneven distribution of electric current in the conductor, is in tandem with high frequency and high speed signal transmission. As the traveling distance on a conductor surface increases, the electric current density in the conductor decreases exponentially. That is, the electric current in the conductor flows mainly at the conductor surface. Accordingly, conductors with small surface-treated surface area favor the high frequency and high speed signal transmission. In contrast, conductors with large surface-treated surface area favor peel strength, which pose a conflict of choice between peel strength and signal integrity (SI). More specifically, a flatter surface profile of copper foil tends to achieve good signal integrity (SI), whereas larger surface area of copper foil tends realize higher peel strength. Therefore, research of a copper clad laminate (CCL) can have good signal integrity, while preserving peel strength is urgently needed for this technical field.

SUMMARY OF THE DISCLOSURE

In response to the above-referenced technical inadequacies, the present disclosure provides an advanced electrodeposited copper foil having island-shaped microstructures, which can be applied to the 5G field requiring high frequency and high speed transmission and can maintain properties required for a target application, such as the peel strength of an electrodeposited copper foil. The present disclosure further provides a copper clad laminate using the advanced electrodeposited copper foil, which can serve as a high frequency and high speed transmission substrate.

In one aspect, the present disclosure provides an advanced electrodeposited copper foil having island-shaped microstructures, which includes a micro-roughened surface. The micro-roughened surface has a plurality of copper crystals that are in a non-uniform distribution. Different quantities of the copper crystals are stacked together to form respective copper whiskers, and different quantities of the copper whiskers are grouped together to form respective copper crystal groups. As observed by a scanning electron microscope operated with a +35 degrees tilt and under 10000× magnification, the micro-roughened surface has the following structural features: (1) at least ten first smooth areas each having a length of 250 nm and a width of 250 nm; (2) at least one second smooth area having a length of 500 nm and a width of 500 nm; (3) at least one island-shaped microstructure having a length of 1500 nm, which has at least three of the copper crystals and/or copper whiskers; and (4) at least two stripe-shaped copper-free areas each having a length of 1000 nm.

In another aspect, the present disclosure provides a copper clad laminate, which includes a substrate and an advanced electrodeposited copper foil. The advanced electrodeposited copper foil is disposed on the substrate and has a micro-roughened surface that is bonded to a surface of the substrate. The micro-roughened surface has a plurality of copper crystals that are in a non-uniform distribution. Different quantities of the copper crystals are stacked together to form respective copper whiskers, and different quantities of the copper whiskers are grouped together to form respective copper crystal groups. As observed by a scanning electron microscope operated with a +35 degrees tilt and under 10000× magnification, the micro-roughened surface has the following structural features: (1) at least ten first smooth areas each having a length of 250 nm and a width of 250 nm; (2) at least one second smooth area having a length of 500 nm and a width of 500 nm; (3) at least one island-shaped microstructure having a length of 1500 nm, which has at least three of the copper crystals and/or copper whiskers; and (4) at least two stripe-shaped copper-free areas each having a length of 1000 nm.

In certain embodiments, no copper crystals are present in each of the first and second smooth areas.

In certain embodiments, each of the copper whiskers has a topmost copper crystal.

In certain embodiments, the topmost copper crystals are each in the shape of a conoid, a rod or a sphere.

In certain embodiments, the micro-roughened surface has a surface roughness (Rz JIS B 0601-1994) less than 2.1 μm.

In certain embodiments, the micro-roughened surface further includes a plurality of peaks and a plurality of grooves between the peaks, and the copper crystals, the copper whiskers and the copper crystal groups are correspondingly formed on the peaks.

In certain embodiments, each of the grooves has a U-shaped or V-shaped cross-sectional profile.

One of the beneficial effects of the present disclosure is that, the advanced electrodeposited copper foil can, without lowering peel strength, reduce insertion loss to increase signal integrity so as to be adaptable to high frequency and high speed signal transmission, thereby meeting the requirements of 5G applications, by the technical features of "the micro-roughened surface has at least ten first smooth areas each having a length of 250 nm and a width of 250 nm, at least one second smooth area having a length of 500 nm and a width of 500 nm, and at least one island-shaped microstructure having a length of 1500 nm which has at least three of the copper crystals and/or copper whiskers."

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
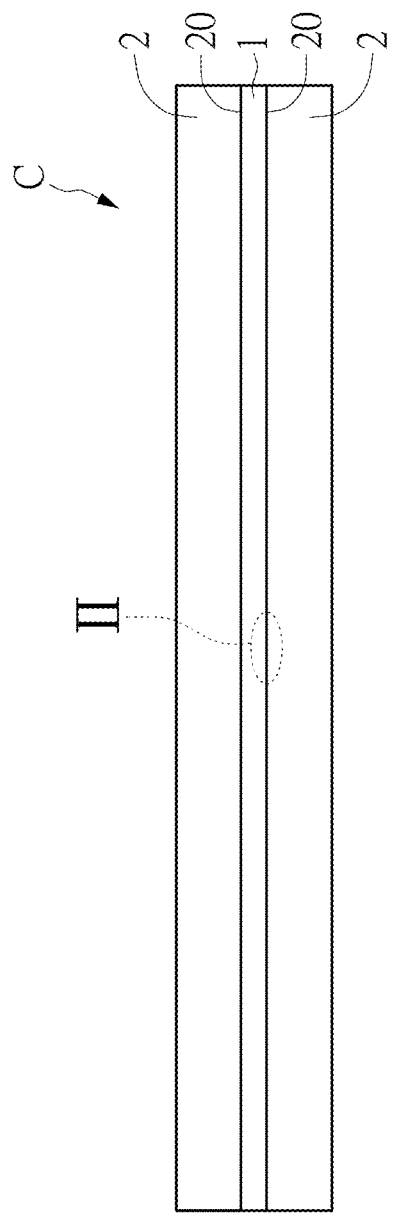
FIG. 1 is a structural schematic view of a copper clad laminate of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
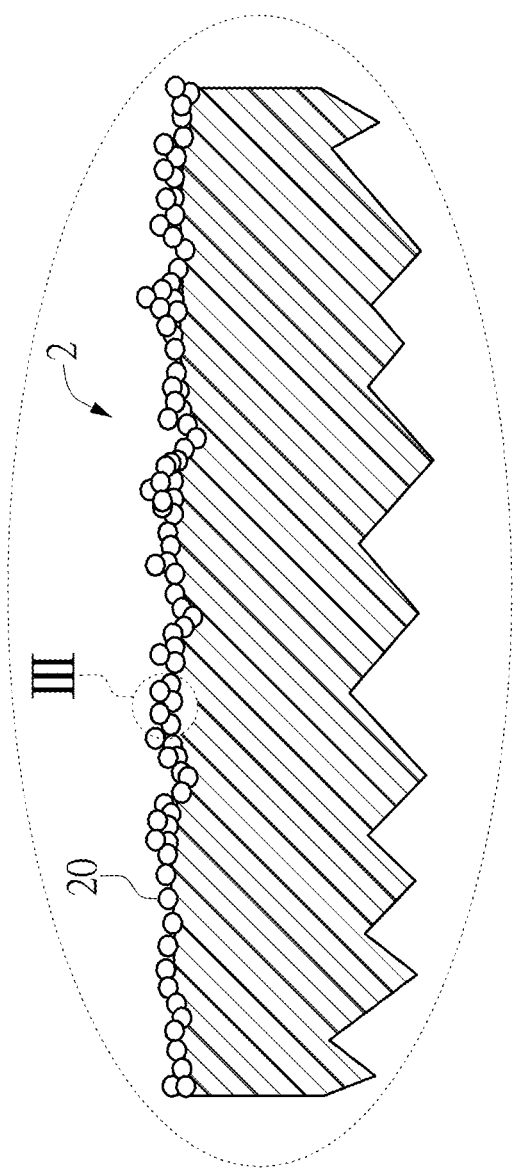
FIG. 2 is an enlarged view of section II of FIG. 1.
Figure 3:
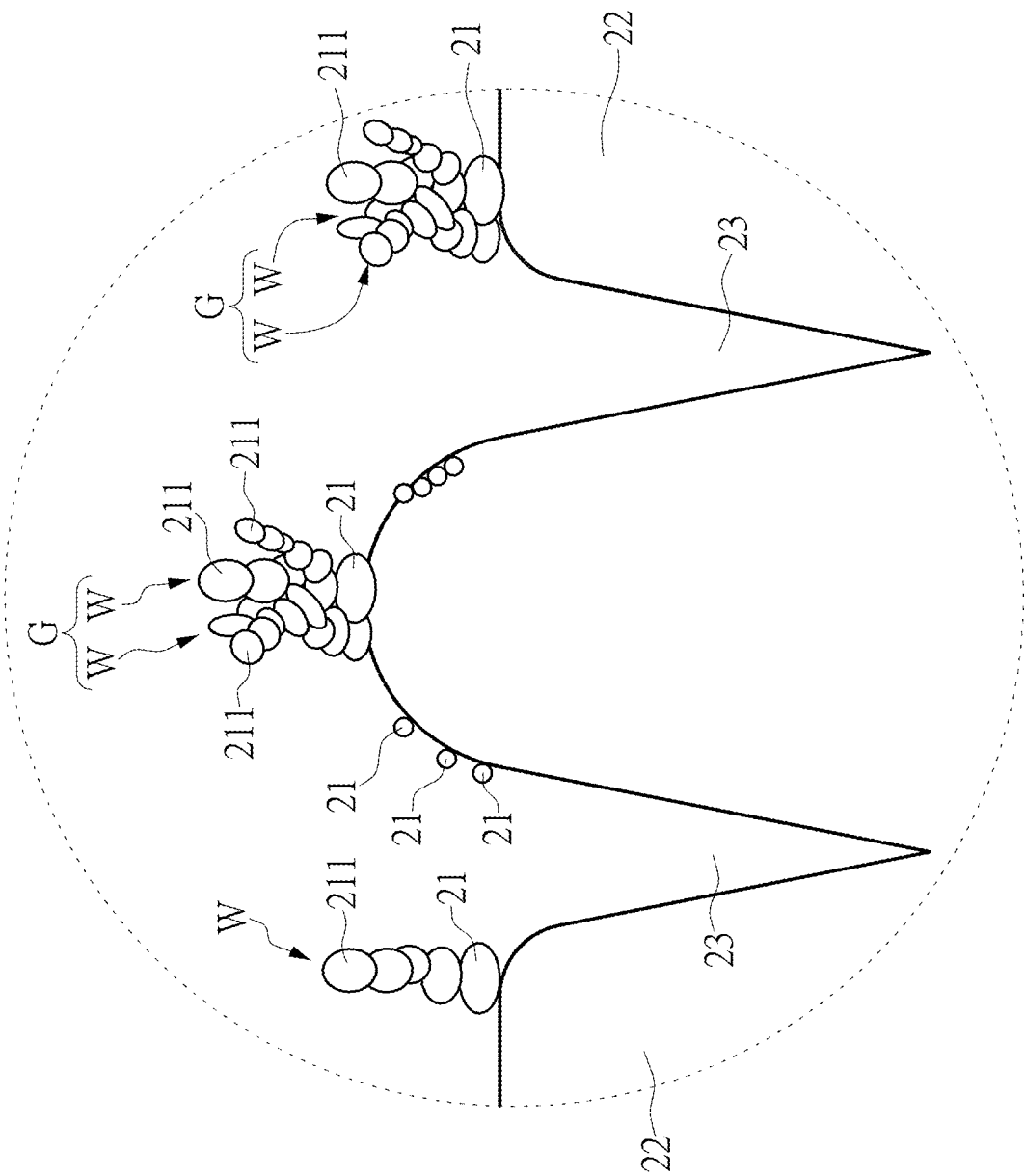
FIG. 3 is an enlarged view of section III of FIG. 2.

Referring to FIG. 1 to FIG. 3, the present disclosure provides a copper clad laminate C that includes a substrate 1 and at least one advanced electrodeposited copper foil 2 disposed on the substrate 1. In the present embodiment, the quantity of the advanced electrodeposited copper foil 2 is two, each of which has an uneven micro-roughened surface 20 that is bonded to a surface of the substrate 1, but the present disclosure is not limited thereto. In other embodiments, the copper clad laminate C can include only one advanced electrodeposited copper foil 2.

In order to reduce insertion loss, the substrate 1 can be formed from a material having a low dissipation factor (Df). The Df of the substrate 1 can be less than or equal to 0.015 at 10 GHz, preferably less than or equal to 0.010, and more preferably less than or equal to 0.005.

More specifically, the substrate 1 is formed from a resin-based composite material (i.e., a prepreg), which is obtained by the steps of impregnating a base material with a synthetic resin and then curing the impregnated base material. Specific examples of the base material include a phenolic cotton paper, a cotton paper, a fabric made of resin fibers, a non-woven fabric made of resin fibers, a glass board, a glass woven fabric and a glass non-woven fabric. Specific examples of the synthetic resin include an epoxy resin, a polyester resin, a polyimide resin, a cyanate ester resin, a bismaleimide triazine resin, a polyphenylene ether resin and a phenol resin. The synthetic resin can be formed into a single-layered or multi-layered structure. The resin-based composite material can be a mid loss, low loss, very low loss or ultra low loss material, which are well-known to people skilled in this art and are specifically exemplified by the products of EM890, EM890(K), EM891(K), EM528, EM526, IT170GRA1, IT958G, IT968G, IT150DA, S7040G, S7439G, S6GX, TU863+, TU883 (A,Sp), MEGTRON 4, MEGTRON 6, MEGTRON 7 and MEGTRON 8. However, these examples are not meant to limit the scope of the present disclosure.

Referring to FIG. 2 and FIG. 3, the micro-roughened surface 20 of the advanced electrodeposited copper foil 2 is formed by a micro-roughening treatment of copper electrodeposition. It is worth mentioning that, the micro-roughened surface 20 has a plurality of copper crystals 21, a plurality of copper whiskers W and a plurality of copper crystal groups G which are in a non-uniform distribution, i.e., being non-uniformly deposited on a copper foil surface. Each of the copper whiskers W is formed by two or more of the copper crystals 21 stacked together, and different quantities of the copper crystals 21 are stacked together to form the respective copper whiskers W. Furthermore, each of the copper whiskers W has a topmost copper crystal 211 that is in the shape of a conoid, a rod or a sphere, and preferably a sphere. Each of the copper crystal groups G is formed by two or more of the copper whiskers W grouped together, and different quantities of the copper whiskers W are grouped together to form the respective copper crystal groups G.

In certain embodiments, the average height of the copper whiskers W can be less than 3 μm, preferably less than 1.8 μm, and more preferably less than 1.0 μm. Furthermore, the average height of the copper crystal groups G can be less than 3.5 μm, preferably less than 1.8 μm, and more preferably less than 1.0 μm. In certain embodiments, each of the copper whiskers W can include up to twenty-five copper crystals 21, preferably up to twelve copper crystals 21, more preferably up to ten copper crystals 21, and most preferably up to eight copper crystals 21. In certain embodiments, the average outer diameter of the copper crystals 21 can be less than 0.5 μm, more preferably between 0.05 μm and 0.5 μm, and most preferably between 0.1 μm and 0.4 μm.

It is worth mentioning that, it is different from the conventional electrodeposited copper foil that, the copper crystals are non-uniformly distributed on the copper foil surface, only a part of which are grouped together. That is, the advanced electrodeposited copper foil 2 of the present disclosure has a surface with an apparent uneven profile, in which not only are the copper crystals 21 non-uniformly distributed, but also the copper whiskers W are respectively formed by different quantities of the copper crystals 21, and the copper crystal groups G are respectively formed by different quantities of the copper whiskers W. Therefore, the advanced electrodeposited copper foil 2 of the present disclosure can increase signal integrity and suppress insertion loss, as well as maintaining good peel strength, to adapt high frequency and high speed signal transmission. In addition, the micro-roughened surface 20 has a surface roughness (Rz JIS B 0601-1994) less than 2.1 μm, which can facilitate a reduction in line width and line spacing.

Reference is again made to FIG. 3. The micro-roughened surface 20 further includes a plurality of peaks 22 and a plurality of grooves 23 between the peaks 22. The copper crystals 21, the copper whiskers W and the copper crystal groups G are correspondingly formed on the peaks 22. Each of the grooves 23 has a U-shaped or V-shaped cross-sectional profile. Accordingly, when the advanced electrodeposited copper foil 2 of the present disclosure is pressed on a resin-based composite material, the micro-roughened surface 20 can receive a greater amount of a resin material so as to increase the bonding strength between the copper foil and the resulting substrate.

Manufacturing Example

Figure 4:
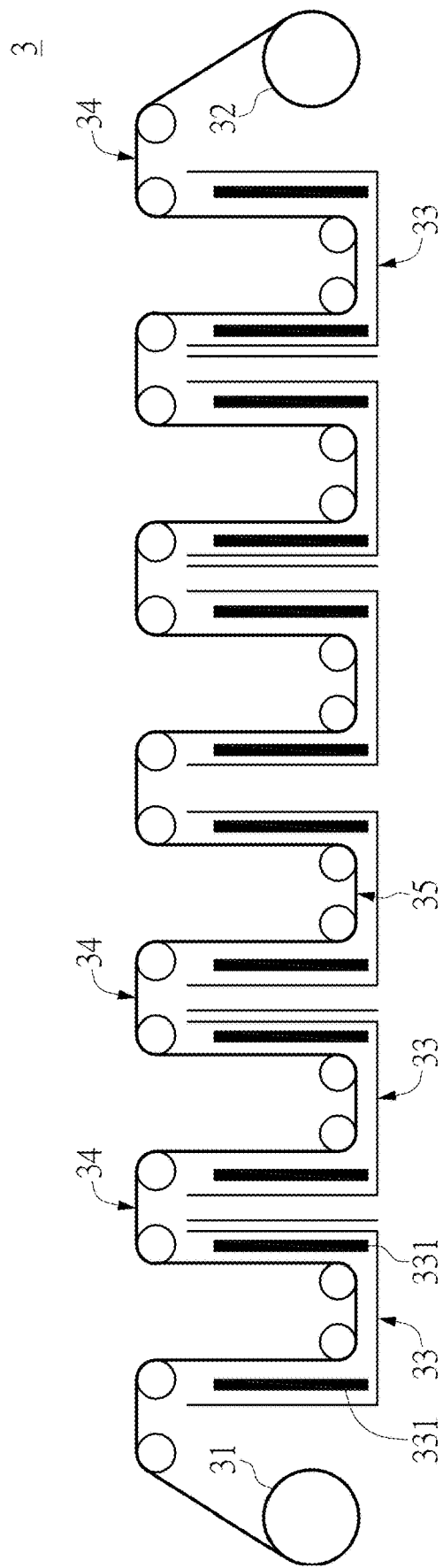
FIG. 4 is a schematic view of a continuous-type electrodepositing apparatus for producing an advanced electrodeposited copper foil having island-shaped microstructures of the present disclosure.

Reference is again made to FIG. 2, along with FIG. 4, a method for manufacturing the advanced electrodeposited copper foil 2 of the present disclosure includes performing a micro-roughening treatment of copper electrodeposition on a matte side of a raw foil, in which the matte side is formed into a micro-roughened surface 20. The micro-roughening treatment of copper electrodeposition can be performed by a conventional apparatus such as a continuous-type electrodepositing apparatus or a batch-type electrodepositing apparatus, which uses a production speed between 5 m/min and 20 m/min, a production temperature between 20° C. and 60° C. and a predetermined current density. It is worth mentioning that, a steel brush can be used to scratch the matte side of the raw foil in advance to form non-directional grooves that form into island-shaped patterns, but the present disclosure is not limited thereto. In certain embodiments, the micro-roughening treatment of copper electrodeposition can also be performed on a shiny side of the raw foil to allow it to be formed into a micro-roughened surface 20.

As shown in FIG. 4, a continuous-type electrodepositing apparatus 3 is used in the manufacturing example, including a feeding roller 31, a receiving roller 32, a plurality of electrolysis tanks 33, a plurality of electrolyzing roller assemblies 34 and a plurality of auxiliary roller assemblies 35. The electrolysis tanks 33 are arranged between the feeding roller 31 and the receiving roller 32 to contain copper-containing plating solutions having the same or different compositions. Each of the electrolysis tanks 33 has a pair of electrodes 331 such as platinum electrodes arranged therein. The electrolyzing roller assemblies 34 are respectively arranged above the electrolysis tanks 33. The auxiliary roller assemblies 35 are respectively arranged in the electrolysis tanks 33. The electrolyzing roller assemblies 34 and the auxiliary roller assemblies 35 can drive a raw foil to sequentially pass through the plating solutions within the electrolysis tanks 33. The electrodes 331 of each of the electrolysis tanks 33 and the corresponding electrolyzing roller assembly 34 are jointly and electrically connected to an external power source (not shown) for electrolyzing the corresponding plating solution, so as to allow the copper foil to have a desired effect.

In practice, the copper-containing plating solutions each contain copper ions, an acid and at least one metal additive. The source of copper ions can be copper sulfate, copper nitrate or a combination thereof. Specific examples of the acid include sulfuric acid, nitric acid or a combination thereof. Specific examples of the at least one metal additive include cobalt, iron, zinc, or a combination thereof. According to requirements, the copper-containing plating solutions can each contain at least one conventional additive such as gelatin, an organic nitride, hydroxyethyl cellulose (HEC), polyethylene glycol (PEG), sodium 3-mercaptopropane sulphonate (MPS), bis-(sodium sulfopropyl)-disulfide (SPS), and a thiourea group-containing compound. However, the above-recited examples are merely exemplary and are not intended to limit the scope of the present disclosure.

It is worth mentioning that, the micro-roughening treatment of copper electrodeposition can be used to produce not only a reverse-treated copper foil, but also a high temperature elongation (HTE) copper foil or a very low profile (VLP) copper foil.

Performance Verification of Copper Foil

Figure 5:
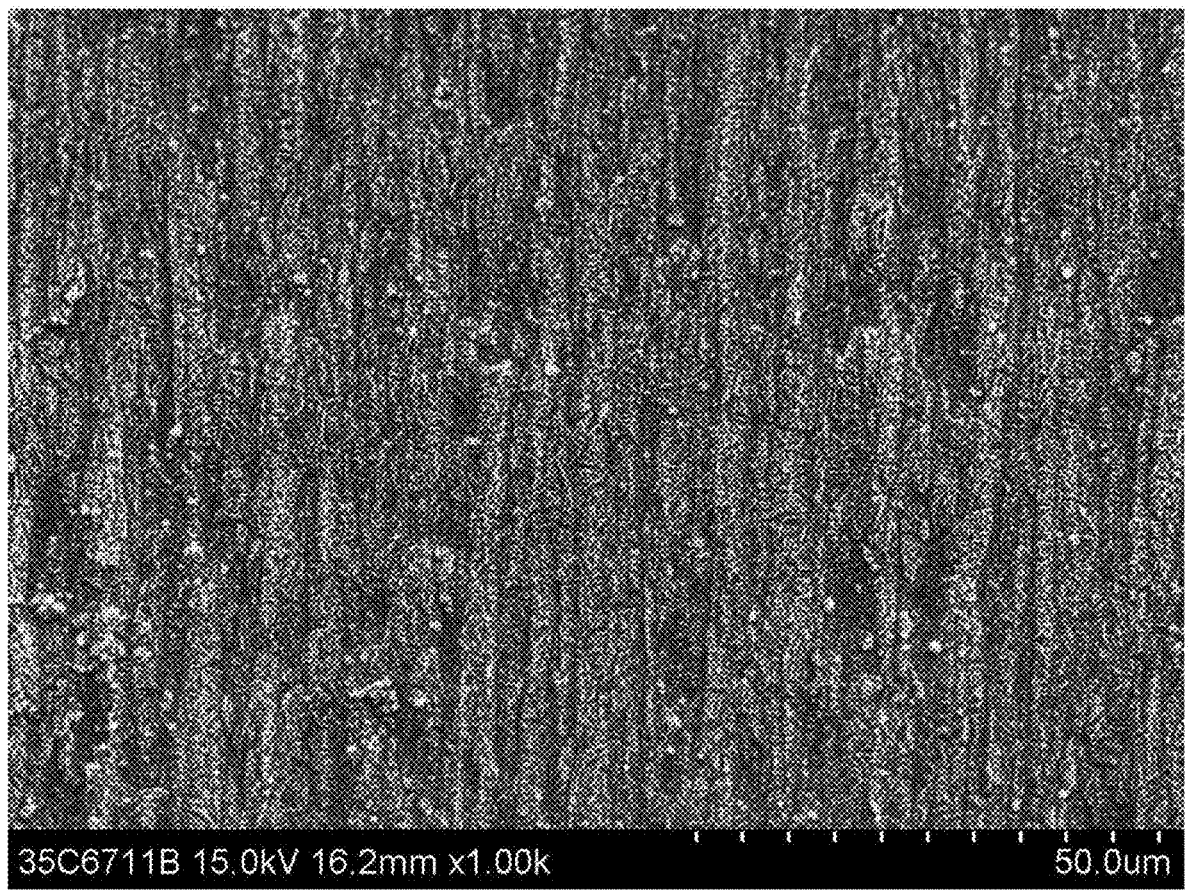
FIG. 5 is a scanning electron microscope image taken with a +35 degree tilt and under 1000× magnification, which shows a surface profile of the advanced electrodeposited copper foil having the island-shaped microstructures of the present disclosure.
Figure 6:
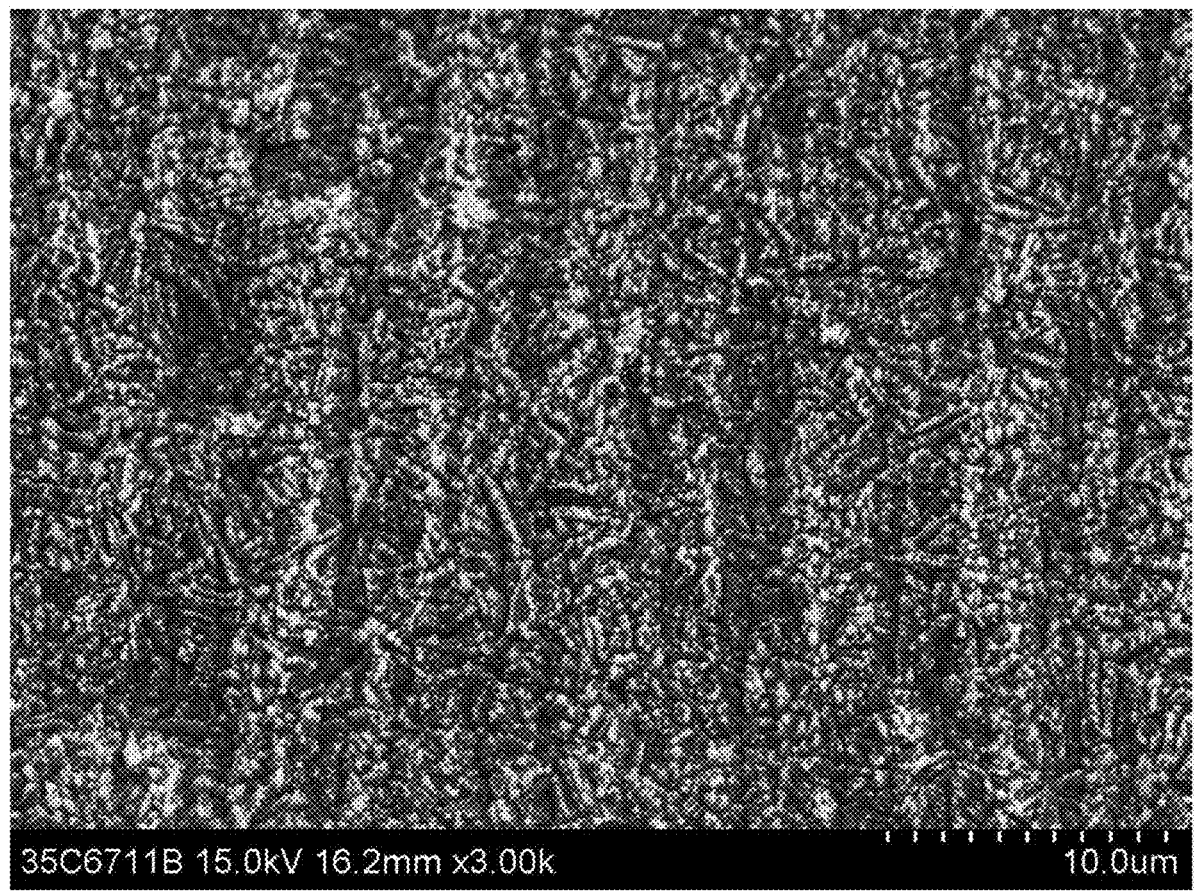
FIG. 6 is a scanning electron microscope image taken with a +35 degree tilt and under 3000× magnification, which shows the surface profile of the advanced electrodeposited copper foil having the island-shaped microstructures of the present disclosure.
Figure 7:
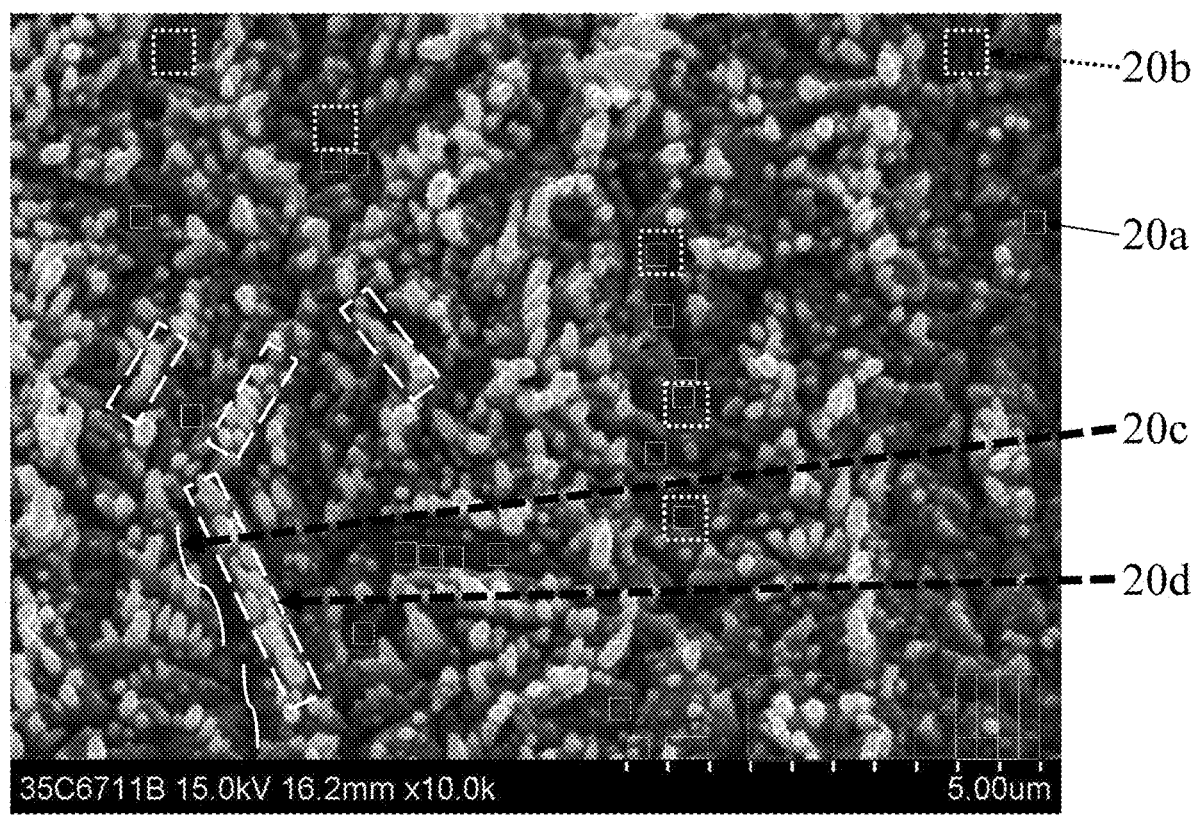
FIG. 7 is a scanning electron microscope image taken with a +35 degree tilt and under 10000× magnification, which shows the surface profile of the advanced electrodeposited copper foil having the island-shaped microstructures of the present disclosure.

An advanced electrodeposited copper foil having island-shaped microstructures of Example 1 (herein after referred to as "copper foil having island-shaped microstructures" or "ULVLP copper foil") is obtained by the above-mentioned micro-roughening treatment of copper electrodeposition. Processing conditions of each treatment stage are shown in Table 1, and surface profiles of the ULVLP copper foil are shown in FIG. 5, FIG. 6 and FIG. 7, which are obtained by a scanning electron microscope (SEM) (S-3400N, manufactured by Hitachi, Ltd.) operated at a +35 degree tilt. FIG. 5 is a SEM image under 1000× magnification, FIG. 6 is a SEM image under 3000× magnification, and FIG. 7 is a SEM image under 10000× magnification.

TABLE 1

| | | First plating stage | Second plating stage | Third plating stage | Fourth plating stage | Fifth plating stage | Sixth plating stage | Seventh plating stage | First trace metal plating stage | Second trace metal plating stage | Third trace metal plating stage | Silane treatment |
|---|---|---|---|---|---|---|---|---|---|---|---|---|
| Conditions of plating solution | Metal ions | $Cu^{+2}$ | $Cu^{+2}$ | $Cu^{+2}$ | $Cu^{+2}$ | $Cu^{+2}$ | $Cu^{+2}$ | $Cu^{+2}$ | $Ni^{+2}$ | $Zn^{+2}$ | $Cr^{+6}$ | N/A |
| | Metal concentration (g/L) | 5.0-10 | 66-80 | 66-80 | 5.0-10 | 5.0-10 | 66-80 | 66-80 | 17-20 | 2-4 | 1-3 | N/A |
| | Chlorine concentration (Ppm) | <3 | <3 | <3 | <3 | <3 | <3 | <3 | <3 | <3 | <3 | <3 |
| | Acid concentration (g/L) | Sulfuric acid 90-100 | Sulfuric acid 60-75 | Sulfuric acid 60-75 | Sulfuric acid 90-100 | Sulfuric acid 90-100 | Sulfuric acid 60-75 | Sulfuric acid 60-75 | Phosphoric acid 3-6 | Boric acid 10-25 | Phosphoric acid 0.1-2.0 | N/A |
| | Trace metal concentration (Ni, Pd, Ag, W ...) (ppm or mg/L) | 180-220 | 30-40 | 30-40 | 180-220 | 180-220 | 30-40 | 30-40 | 100-200 | 100-200 | 100-200 | N/A |
| | Time (Sec) | 1.69 | 2.06 | 2.06 | 1.69 | 1.69 | 2.06 | 2.06 | 2.25 | 2.06 | 2.25 | 3 |
| | Temperature (° C.)(±5° C.) | 30 | 45 | 45 | 30 | 30 | 45 | 45 | 28 | 30 | 40 | 40 |
| | pH | <1.5 | <1.5 | <1.5 | <1.5 | <1.5 | <1.5 | <1.5 | 3-4 | 4-5 | 3-4 | 5-7 |
| Example 1 | Current density ($A/dm^2$)(±10%) | 0.01 | 13.37 | 13.37 | 21.24 | 21.24 | 4.01 | 0.01 | 1.1 | 0.6 | 0.6 | N/A |
| Example 2 | Current density ($A/dm^2$)(±10%) | 0.01 | 15.00 | 15.00 | 16.00 | 16.00 | 4.01 | 0.01 | 1.1 | 0.6 | 0.6 | N/A |

It can be observed from FIG. 5 and FIG. 6 that in the copper foil having island-shaped microstructures of Example 1, the copper crystals 21, the copper whiskers W and the copper crystal groups G form into an uneven island-shaped pattern. Furthermore, it can be observed from FIG. 7 that the copper foil having island-shaped microstructures of Example 1 has a micro-roughened surface with the following structural features: (1) at least ten first smooth areas 20a each having a length of 250 nm and a width of 250 nm; (2) at least one second smooth area 20b having a length of 500 nm and a width of 500 nm; (3) at least one island-shaped microstructure 20c having a length of 1500 nm, which has at least three of the copper crystals and/or copper whiskers; and (4) at least two stripe-shaped copper-free areas 20d each having a length of 1000 nm. The structural features (1) and (2) can facilitate a decrease in copper foil surface area.

It is worth mentioning that, the above-mentioned structural features are all observed from an image showing a copper foil surface profile, which is obtained by a scanning electron microscope (S-3400N, manufactured by Hitachi, Ltd.) operated with a +35 degrees tilt and under a suitable magnification (if the magnification is not specified, it means 10000x). The corresponding area size of the image is about 12.7 μm×9.46 μm, which is close to 120 μm2. The terms "first smooth area 20a" and "second smooth area 20b" mean areas where there are no copper crystals, as observed from a SEM image. The term "island-shaped microstructure 20c" means a structure having a contour shape close to an island or a peninsula and formed with smooth areas therearound, as observed from a SEM image. The term "stripe-shaped copper-free area 20d" means an area where there are no copper crystals, which has a width to length ratio less than ⅓ (for example, ¹⁄₁₀, ¹⁄₁₀₀ or ¹⁄₁₀₀₀), and may have a linear or non-linear shape and an uniform or non-uniform width.

The ULVLP copper foils of Example 1 are used to manufacture respective copper clad laminates together with different types of prepregs, which are tested for insertion loss value. The results are shown in Table 2.

TABLE 2

| Prepreg | | Delta-L test method | PCIe-PCB material and loss target (with reference to the target set by Intel) | | | |
|---|---|---|---|---|---|---|
| Type | Df | (Intel) Electrical property item | Insertion loss at 4 GHz (dB/in) | Insertion loss at 8 GHz (dB/in) | Insertion loss at 12.89 GHz (dB/in) | Insertion loss at 16 GHz (dB/in) |
| Mid loss | 0.015->0.010 | Stripline | −0.65 | −1.16 | −1.74 | −2.30 |
| Low loss | 0.010->0.005 | Stripline | −0.50 | −0.85 | −1.25 | −1.49 |
| Ultra low loss | 0.005-0.0005 | Stripline | −0.35 | −0.58 | −0.83 | −0.96 |

Test Example 11

Figure 8:
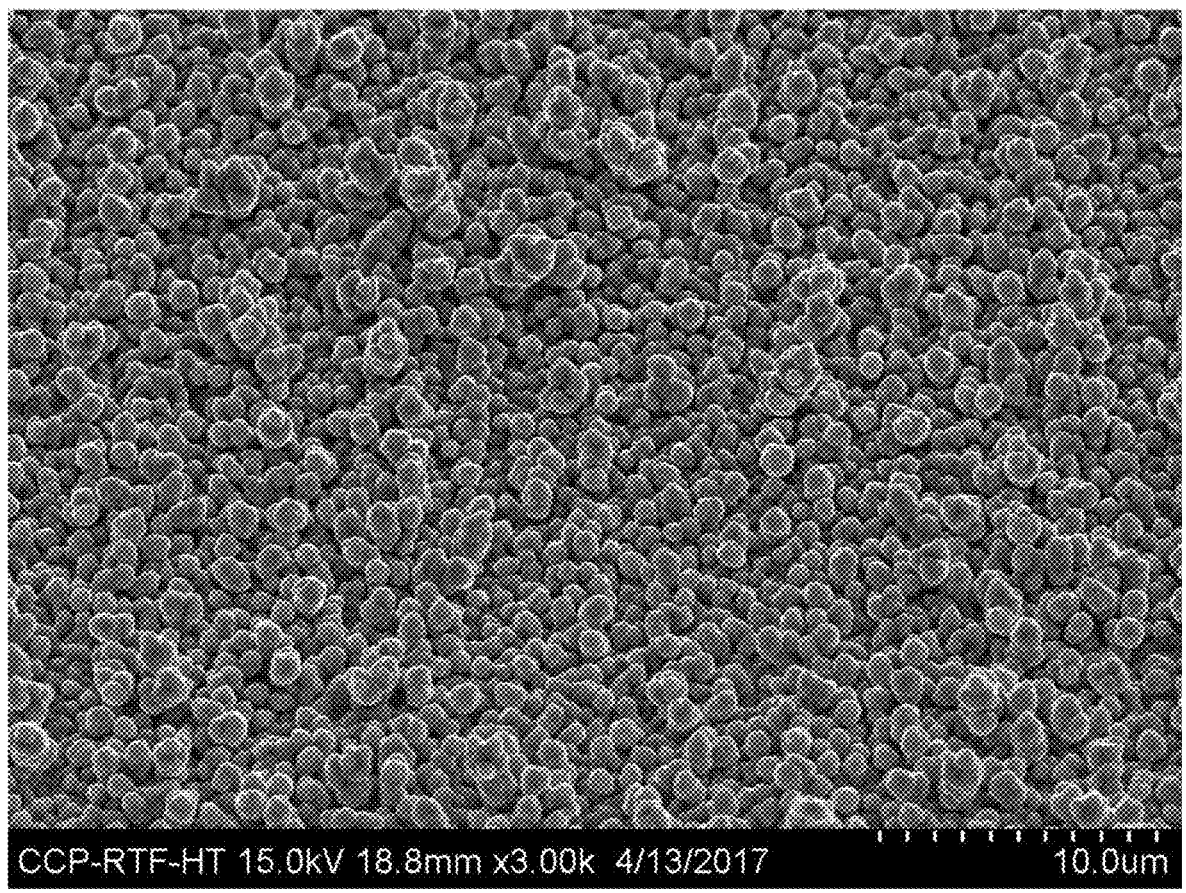
FIG. 8 is a scanning electron microscope image showing a surface profile of a conventional RTF-3 copper foil.
Figure 9:
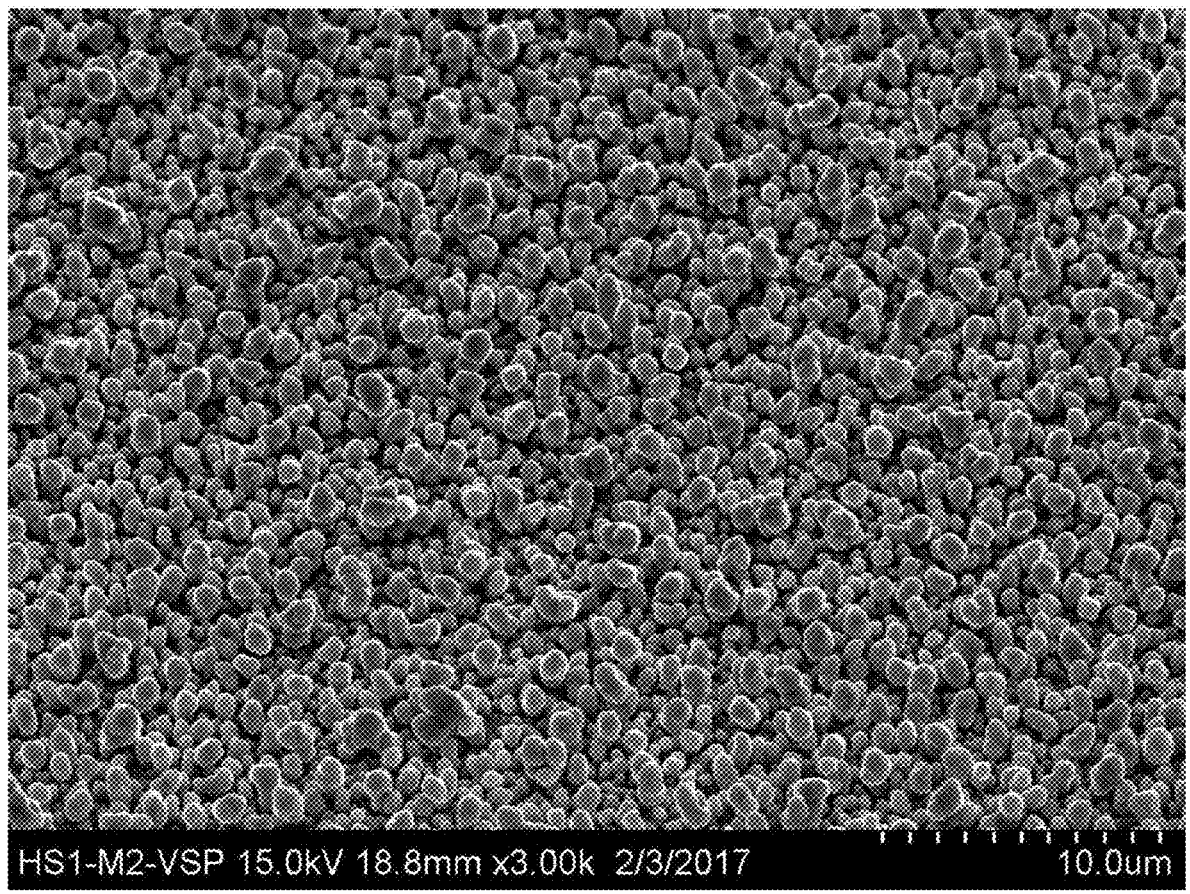
FIG. 9 is a scanning electron microscope image showing a surface profile of a conventional MLS-G copper foil.

Each of ULVLP copper foils of Examples 1 and 2, an electrodeposited copper foil according to Taiwan Patent Application No. 107133827 (product name: RG311, hereinafter referred to as "RG311 copper foil") and an electrodeposited copper foil produced by the C company (product name: RTF-3, herein after referred to as "RTF-3 copper foil") is laminated with a mid loss prepreg (product name: IT170GRA1) produced by the I company, so as to form a single-layered copper clad laminate after being cured, respectively. The RG311 copper foil has a surface roughness (Rz JIS B 0601-1994) that is less than 2.3 μm. The surface profile of the RTF-3 copper foil is shown in FIG. 8, which is obtained by a scanning electron microscope (S-3400N, manufactured by Hitachi, Ltd.) with a +35 degree tilt and under 10000× magnification. As shown in FIG. 8, copper crystals are apparently present in a uniform distribution on a copper foil surface. The peel strengths of the single-layered copper clad laminates all meet the practical requirements of. The single-layered copper clad laminates are tested for signal integrity by the Delta-L test method provided by the Intel Corporation, and test conditions include a core thickness of 3 mils core (1 oz), 10 mils PP and 4.5 mils trace width. The results are shown in Table 3.

TABLE 3

| Material | Df level | Dk @ 10 GHz RC 50% | Df @ 10 GHz RC 50% | Copper foil level | Copper model | SL Loss (dB/in) 8 GHz | SL Loss (dB/in) 16 GHz | Increase compared to Comparative Example 1 8 GHz | Increase compared to Comparative Example 1 16 GHz |
|---|---|---|---|---|---|---|---|---|---|
| IT-170GRA1 | Mid Loss | 3.90 | 0.0100 | Comparative Example 1 | RTF-3 | −0.9395 | −1.7694 | 0.00% | 0.00% |
| | | | | Comparative Example 2 | RG311 | −0.8321 | −1.4986 | 11.43% | 15.30% |
| | | | | Example 1 | ULVLP | −0.7839 | −1.4022 | 16.56% | 20.75% |
| | | | | Example 2 | ULVLP | −0.7418 | −1.3380 | 21.04% | 24.38% |

It can be seen from the test results shown in Table 3 that, at a frequency of 8 GHz, the insertion loss of the ULVLP copper foil is about 16% to 21% less than that of the RTF-3 copper foil and is about 5% to 10% less than that of the RG311 copper foil. At a frequency of 16 GHz, the insertion loss of the ULVLP copper foil is about 20% to 24% less than that of the RTF-3 copper foil and is about 6% to 10% less than that of the RG311 copper foil. Therefore, compared to the RTF-3 and RG311 copper foils, the ULVLP copper foil has better signal integrity.

Test Example 2

Each of ULVLP copper foils of Examples 1 and 2, an electrodeposited copper foil according to Taiwan Patent Application No. 107133827 (product name: RG311, herein after referred to as "RG311 copper foil") and an electrodeposited copper foil produced by the C company (product name: RTF-3, herein after referred to as "RTF-3 copper foil") is laminated with a mid loss prepreg (product name: IT985G) produced by the I company, so as to form a single-layered copper clad laminate after being cured, respectively. The RG311 has a surface roughness (Rz JIS B 0601-1994) that is less than 2.3 μm. The surface profile of the RTF-3 copper foil is shown in FIG. 8, which is obtained by a scanning electron microscope (S-3400N, manufactured by Hitachi, Ltd.) with a +35 degree tilt and under 10000× magnification. As shown in FIG. 8, copper crystals are apparently present in a uniform distribution on a copper foil surface. The peel strengths of the single-layered copper clad laminates all meet the practical requirements. The single-layered copper clad laminates are tested for signal integrity by the Delta-L test method provided by the Intel Corporation, and test conditions include a core thickness of 3 mils core (1 oz), 10 mils PP and 4.5 mils trace width. The results are shown in Table 4.

TABLE 4

| Material | Df level | Dk @ 10 GHz RC 50% | Df @ 10 GHz RC 50% | Copper foil level | Copper model | SL Loss (dB/in) 8 GHz | SL Loss (dB/in) 16 GHz | Increase compared to Comparative Example 1 8 GHz | Increase compared to Comparative Example 1 16 GHz |
|---|---|---|---|---|---|---|---|---|---|
| IT-958G | Low Loss | 3.70 | 0.0070 | Comparative Example 1 | RTF-3 | −0.7906 | −1.4491 | 0.00% | 0.00% |
| | | | | Comparative Example 2 | RG311 | −0.6996 | −1.2415 | 11.51% | 14.33% |
| | | | | Example 1 | ULVLP | −0.6657 | −1.1838 | 15.80% | 18.31% |
| | | | | Example 2 | ULVLP | −0.6283 | −1.1063 | 20.53% | 23.66% |

It can be seen from the test results shown in Table 4 that, at a frequency of 8 GHz, the insertion loss of the ULVLP copper foil is about 15.80% to 20.53% less than that of the RTF-3 copper foil and is about 3% to 9% less than that of the RG311 copper foil. At a frequency of 16 GHz, the insertion loss of the ULVLP copper foil is about 18% to 23% less than that of the RTF-3 copper foil and is about 4.6% to 10.8% less than that of the RG311 copper foil. Therefore, compared to the RTF-3 and RG311 copper foils, the ULVLP copper foil has better signal integrity.

Test Example 3

Each of ULVLP copper foils of Examples 1 and 2, an electrodeposited copper foil according to Taiwan Patent Application No. 107133827 (product name: RG311, herein after referred to as "RG311 copper foil") and an electrodeposited copper foil produced by the M company (product name: HS1-M2-VSP, herein after referred to as "HS1-M2-VSP copper foil") are is laminated with an ultra low loss prepreg (product name: IT968) produced by the I company, so as to form a single-layered copper clad laminate after being cured, respectively. The RG311 has a surface roughness (Rz JIS B 0601-1994) that is less than 2.3 μm. The peel strengths of the single-layered copper clad laminates all meet the practical requirements of. The single-layered copper clad laminates are tested for signal integrity by the Delta-L test method provided by the Intel Corporation, and test conditions include a core thickness of 3 mils core (1 oz), 10 mils PP and 4.5 mils trace width. The results are shown in Table 5.

TABLE 5

| Material | Df level | Dk @ 10 GHz RC 50% | Df @ 10 GHz RC 50% | Copper foil level | Copper model | SL Loss (dB/in) | | Increase compared to Comparative Example 1 | |
|---|---|---|---|---|---|---|---|---|---|
| | | | | | | 8 GHz | 16 GHz | 8 GHz | 16 GHz |
| IT-968 | Ultra Low | 3.66 | 0.0050 | Comparative Example 1 | HS1-M2-VSP | −0.6013 | −1.0403 | 0.00% | 0.00% |
| | | | | Comparative Example 2 | RG311 | −0.5489 | −0.9208 | 8.71% | 11.49% |
| | | | | Example 1 | ULVLP | −0.5209 | −0.8667 | 13.37% | 16.69% |
| | | | | Example 2 | ULVLP | −0.4927 | −0.8202 | 18.06% | 21.06% |

It can be seen from the test results shown in Table 5 that, at a frequency of 8 GHz, the insertion loss of the ULVLP copper foil is about 16.04% to 19.73% less than that of the HS1-M2-VSP copper foil and is about 5% to 10% less than that of the RG311 copper foil. At a frequency of 16 GHz, the insertion loss of the ULVLP copper foil is about 16% to 21% less than that of the HS1-M2-VSP copper foil and is about 5% to 10% less than that of the RG311 copper foil. Therefore, compared to the HS1-M2-VSP and RG311 copper foils, the ULVLP copper foil has better signal integrity.

One of the effects of the present disclosure is that, the advanced electrodeposited copper foil can, without lowering peel strength, reduce insertion loss to increase signal integrity so as to adapt high frequency and high speed signal transmission, thereby meeting the requirements of 5G applications, by the technical features of "the micro-roughened surface has at least ten first smooth areas each having a length of 250 nm and a width of 250 nm, at least one second smooth area having a length of 500 nm and a width of 500 nm, and at least one island-shaped microstructure having a length of 1500 nm which has at least three of the copper crystals and/or copper whiskers." It should be noted that, the advanced electrodeposited copper foil is not limited to a reverse-treated electrodeposited copper foil, and can be applied to a copper foil having a surface roughness (Rz JIS B 0601-1994) less than 2.1 μm.

It is worth mentioning that, the present disclosure substantially uses a technical solution that is discarded due to a technical prejudice in the art, which allows a copper foil surface to have a certain degree of unevenness. The technical solution can directly achieve the beneficial technical effect of further optimizing electrical properties on the premise of maintaining good peel strength.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An advanced electrodeposited copper foil having island-shaped microstructures, characterized by including a micro-roughened surface, wherein the micro-roughened surface has a plurality of copper crystals that are in a non-uniform distribution;
   wherein different quantities of the copper crystals are stacked together to form respective copper whiskers, and different quantities of the copper whiskers are grouped together to form respective copper crystal groups;
   wherein as observed by a scanning electron microscope operated with a +35 degrees tilt and under 10000× magnification, the micro-roughened surface has at least ten first smooth areas each having a length of 250 nm and a width of 250 nm, at least one second smooth area having a length of 500 nm and a width of 500 nm, and at least one island-shaped microstructure having a length of 1500 nm.

2. The advanced electrodeposited copper foil according to claim 1, wherein no copper crystals are present in each of the first and second smooth areas.

3. The advanced electrodeposited copper foil according to claim 1, wherein as observed by the scanning electron microscope operated with a +35 degrees tilt and under 10000× magnification, the at least one island-shaped microstructure has at least three of the copper crystals and/or copper whiskers.

4. The advanced electrodeposited copper foil according to claim 1, wherein each of the copper whiskers has a topmost copper crystal.

5. The advanced electrodeposited copper foil according to claim 4, wherein the topmost copper crystals are each in the shape of a conoid, a rod or a sphere.

6. The advanced electrodeposited copper foil according to claim 1, wherein the micro-roughened surface further has at least two stripe-shaped copper-free areas each having a length of 1000 nm.

7. The advanced electrodeposited copper foil according to claim 1, wherein the micro-roughened surface has a surface roughness (Rz JIS B 0601-1994) less than 2.1 μm.

8. The advanced electrodeposited copper foil according to claim 1, wherein the micro-roughened surface further includes a plurality of peaks and a plurality of grooves between the peaks, and the copper crystals, the copper whiskers and the copper crystal groups are correspondingly formed on the peaks.

9. The advanced electrodeposited copper foil according to claim 8, wherein each of the grooves has a U-shaped or V-shaped cross-sectional profile.

10. A copper clad laminate, comprising:
a substrate; and
an advanced electrodeposited copper foil disposed on the substrate and having a micro-roughened surface that is bonded to a surface of the substrate, wherein the micro-roughened surface has a plurality of copper crystals that are in a non-uniform distribution;
wherein different quantities of the copper crystals are stacked together to form respective copper whiskers, and different quantities of the copper whiskers are grouped together to form respective copper crystal groups;
wherein as observed by a scanning electron microscope operated with a +35 degrees tilt and under 10000× magnification, the micro-roughened surface has at least ten first smooth areas each having a length of 250 nm and a width of 250 nm, at least one second smooth area having a length of 500 nm and a width of 500 nm, and at least one island-shaped microstructure having a length of 1500 nm.

11. The copper clad laminate according to claim 10, wherein no copper crystals are present in each of the first and second smooth areas.

12. The copper clad laminate according to claim 10, wherein as observed by the scanning electron microscope operated with a +35 degrees tilt and under 10000× magnification, the at least one island-shaped microstructure has at least three of the copper crystals and/or the copper whiskers.

13. The copper clad laminate according to claim 10, wherein each of the copper whiskers has a topmost copper crystal.

14. The copper clad laminate according to claim 13, wherein the topmost copper crystals are each in the shape of a conoid, a rod or a sphere.

15. The copper clad laminate according to claim 10, wherein the micro-roughened surface further has at least two stripe-shaped copper-free areas each having a length of 1000 nm.

16. The copper clad laminate according to claim 10, wherein the micro-roughened surface has a surface roughness (Rz JIS B 0601-1994) less than 2.1 μm.

17. The copper clad laminate according to claim 10, wherein the micro-roughened surface further includes a plurality of peaks and a plurality of grooves between the peaks, and the copper crystals, the copper whiskers and the copper crystal groups are correspondingly formed on the peaks.

18. The copper clad laminate according to claim 17, wherein each of the grooves has a U-shaped or V-shaped cross-sectional profile.

* * * * *